(12) United States Patent
Sutherland

(10) Patent No.: US 10,667,432 B2
(45) Date of Patent: May 26, 2020

(54) HEAT SPREADER TO STRUCTURALLY SUPPORT AN OUTER HOUSING

(71) Applicant: HEWLETT-PACKARD DEVELOPMENT COMPANY, L.P., Houston, TX (US)

(72) Inventor: Timothy J Sutherland, San Diego, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/091,023

(22) PCT Filed: Jul. 6, 2016

(86) PCT No.: PCT/US2016/041080
§ 371 (c)(1),
(2) Date: Oct. 3, 2018

(87) PCT Pub. No.: WO2018/009178
PCT Pub. Date: Jan. 11, 2018

(65) Prior Publication Data
US 2019/0132993 A1     May 2, 2019

(51) Int. Cl.
*H05K 5/00* (2006.01)
*H05K 7/20* (2006.01)
(Continued)

(52) U.S. Cl.
CPC ........... *H05K 7/20436* (2013.01); *G06F 1/20* (2013.01); *G06F 1/203* (2013.01); *G12B 15/06* (2013.01); *H05K 5/0017* (2013.01); *H05K 5/0086* (2013.01); *H05K 5/03* (2013.01); *H05K 7/20327* (2013.01); *H05K 7/20463* (2013.01); *G06F 1/1698* (2013.01); *G06F 2200/201* (2013.01); *H01Q 7/00* (2013.01)

(58) Field of Classification Search
CPC ....................................................... H05K 5/00
See application file for complete search history.

(56) References Cited

U.S. PATENT DOCUMENTS 6,072,697 A    6/2000   Garcia-Ortiz
6,317,325 B1 * 11/2001  Patel .................. H05K 7/20445
                                                        165/185
(Continued)

FOREIGN PATENT DOCUMENTS

CN    204559640    8/2015
CN    205071063    3/2016
(Continued)

OTHER PUBLICATIONS

Kelvin Thermal http://www.kelvinthermal.com/secure-buyers.php.

*Primary Examiner* — Jerry Wu
(74) *Attorney, Agent, or Firm* — Thorpe, North & Western

(57) ABSTRACT

In some examples, an electronic device includes an outer housing and a heat spreader inside an inner chamber defined by the outer housing. The heat spreader is structurally engaged to the outer housing to provide structural support for the outer housing, and the heat spreader is to spread heat along two different directions. Electronic components are in thermal contact with a surface of the heat spreader to transfer heat produced by the electronic components to the heat spreader.

14 Claims, 2 Drawing Sheets

(51) Int. Cl.
  *G12B 15/06* (2006.01)
  *G06F 1/20* (2006.01)
  *H05K 5/03* (2006.01)
  *G06F 1/16* (2006.01)
  *H01Q 7/00* (2006.01)

(56) References Cited

U.S. PATENT DOCUMENTS

| | | |
|---|---|---|
| 7,188,484 B2 | 3/2007 | Kim |
| 7,486,517 B2 | 2/2009 | Aapro et al. |
| 7,556,086 B2 | 7/2009 | Joshi et al. |
| 7,957,131 B1 | 6/2011 | Mongia et al. |
| 9,258,928 B2 | 2/2016 | Hill et al. |
| 9,310,139 B2 | 4/2016 | Vadakkanmaruveedu et al. |
| 9,342,119 B1 | 5/2016 | Carlson et al. |
| 2005/0136969 A1 | 6/2005 | Park |
| 2010/0072952 A1 | 3/2010 | Makajima |
| 2012/0020017 A1 | 1/2012 | Kehret et al. |
| 2012/0044635 A1 | 2/2012 | Rothkopf |
| 2014/0062799 A1* | 3/2014 | Sutherland ........... H01Q 1/2266 343/702 |
| 2014/0262161 A1 | 9/2014 | Weigand |
| 2015/0043161 A1 | 2/2015 | Nelson et al. |
| 2015/0077929 A1 | 3/2015 | Honmura et al. |
| 2015/0198380 A1 | 7/2015 | Haj-Hariri et al. |
| 2015/0201530 A1 | 7/2015 | Liu et al. |
| 2015/0253823 A1 | 9/2015 | Han |
| 2016/0123678 A1* | 5/2016 | Hulse .................... H01L 23/427 165/104.21 |

FOREIGN PATENT DOCUMENTS

| | | |
|---|---|---|
| RU | 2054835 C1 | 2/1996 |
| RU | 2406282 C1 | 12/2010 |
| RU | 2580675 C2 | 4/2016 |

* cited by examiner

HEAT SPREADER TO STRUCTURALLY SUPPORT AN OUTER HOUSING

BACKGROUND

During operation of an electronic device, active electronic components in the electronic device can produce heat. An electronic device can include a cooling mechanism to cool the heat producing components. The cooling mechanism can include a passive cooling mechanism such as a heat sink that can be attached to a heat producing component. In some examples, the cooling mechanism can include an airflow generator, such as a fan, to generate cooling airflow to assist in cooling the active electronic components.

BRIEF DESCRIPTION OF THE DRAWINGS

Some implementations of the present disclosure are described with respect to the following figures.

DETAILED DESCRIPTION

Examples of electronic devices include any of the following: a desktop computer, a notebook computer, a tablet computer, a smartphone, a game appliance, an electronic device in a vehicle, a wearable device (e.g., a smart watch, smart eyeglasses, etc.), a server computer, a communication node, or any other type of electronic device.

An electronic device can include active electronic components. An "active electronic component" can refer to a chip, a circuit board, or any other integrated arrangement of electronic elements (such as transistors, diodes, etc.) that can be powered to perform a respective operation (or operations). An active electronic component can produce heat when in active operation. An active electronic component is an example of a "heat producing component." To dissipate heat from the active electronic components, a cooling mechanism can be included in the electronic device.

To make electronic devices with thin profiles, an outer housing of an electronic device can be made relatively thin. To provide support for the thin outer housing, a midframe (or more generally, a support frame) can be arranged inside an inner chamber defined by the outer housing, where the support frame is to provide structural support for the outer housing. In some cases, the support frame can be formed of aluminum. However, the presence of both the support frame and a cooling mechanism inside the inner chamber of the electronic device can take up valuable space inside the electronic device, which can reduce the amount of space for other device components, or can cause the profile of the electronic device to increase in size.

In accordance with some implementations of the present disclosure, a multi-dimensional heat spreader is used that can perform both heat dissipation and can provide structural support for an outer housing of an electronic device. As a result, a separate support frame that is distinct from the heat spreader does not have to be provided in the inner chamber of the electronic device to structurally support the outer housing. Instead, the multi-dimensional heat spreader itself can be structurally engaged to the outer housing to provide structural support for the outer housing.

Figure 1:
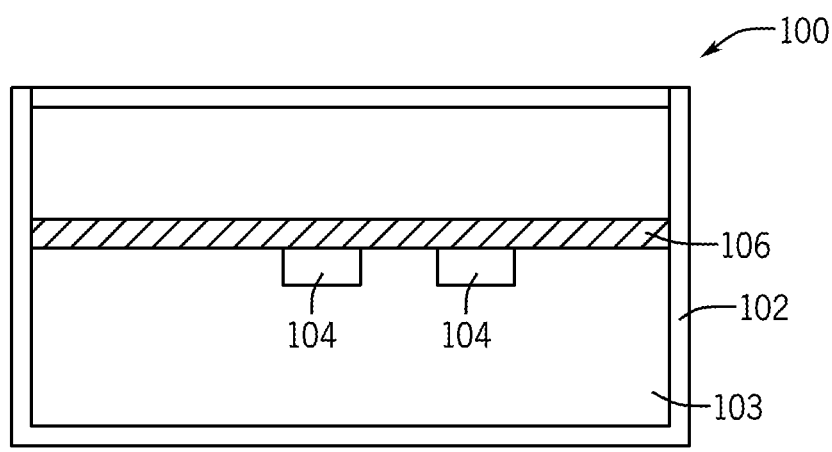
FIG. 1 is a sectional view of an electronic device that includes a multi-dimensional heat spreader that also functions as a structural support for an outer housing of the electronic device, according to some examples.

FIG. 1 is a schematic cross-sectional view of an electronic device 100 that includes an outer housing 102 that defines an inner chamber 103. The outer housing 102 can include a unitary housing structure, or an arrangement of multiple housing structures that are attached or connected to each other. The outer housing 102 can be formed of any rigid material of sufficient strength to support device components inside the electronic device 100. For example, the outer housing 102 can be formed of a material including a polymer (such as a plastic), a metal, a combination thereof, and/or any other material.

Device components can be provided inside the inner chamber 103. Such device components can include active electronic components 104 that produce heat during operation. Although just two active electronic components are depicted in FIG. 1, it is noted that in other examples, a different number of active electronic components can be included in the inner chamber 103. As examples, the active electronic components 104 can include a processor, a memory device, an input/output (IO) device, a circuit board, and so forth. The device components that can be included in the inner chamber 103 can also include components that are not active components.

A multi-dimensional heat spreader 106 is also provided inside the inner chamber 103. The multi-dimensional heat spreader 106 is able to spread heat along multiple dimensions, including multiple orthogonal horizontal dimensions in the view of FIG. 1. In other examples, the multi-dimensional heat spreader can additionally spread heat in a third direction, such as a vertical direction in the view of FIG. 1. In some examples, the multi-dimensional heat spreader 106 can have a generally rectangular shape and can be formed as a sheet. In other examples, the heat spreader 106 can have other shapes.

The active electronic components 104 are thermally contacted to a thermal contact surface of the heat spreader 106, either directly or indirectly through a thermally conductive layer, such as a thermal paste or other type of layer.

The heat spreader 106 is formed to be structurally rigid such that when the heat spreader 106 is structurally engaged to the outer housing 102, the heat spreader 106 provides structural support for the outer housing 102. Providing structural support for an outer housing can refer to supporting the outer housing such that a force applied to the outer housing does not cause a deflection or warping of the outer housing.

Figure 2A:
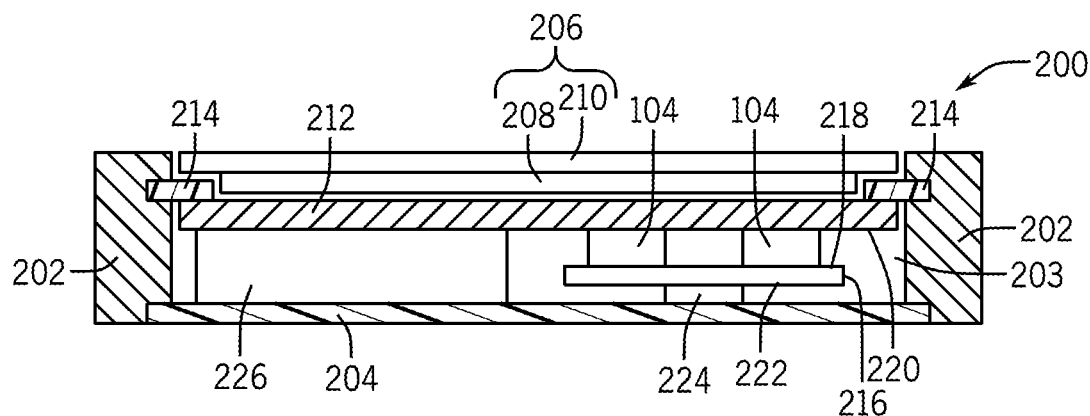
FIG. 2A is a sectional view of an electronic device that includes a multi-dimensional heat spreader that also functions as a structural support for an outer housing of the electronic device, according to further examples.
Figure 2B:
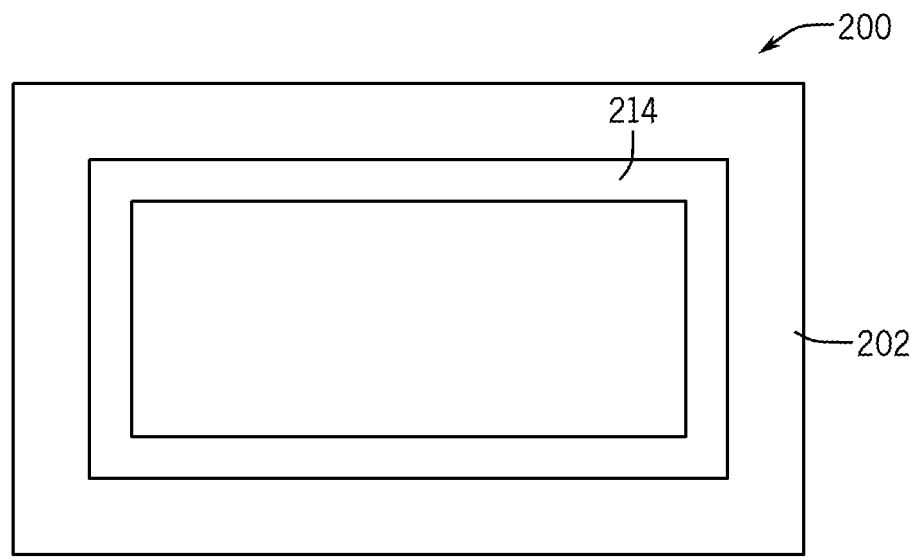
FIG. 2B is a top view of a portion of the electronic device of FIG. 2A, according to some examples.

FIG. 2A is a cross-sectional view of an electronic device 200 according to further examples. FIG. 2B is a top view of the electronic device 200, with components within the inner chamber of the electronic device 200 omitted in the view. In the example of FIGS. 2A-2B, an outer housing includes a metal ring 202 (or more generally, a housing ring that is formed of a metal or other structurally rigid material) that extends around a perimeter of the electronic device, as shown in the top view of the electronic device 200 in FIG.

2B. A ring can refer to a structure that extends around a loop, which in FIG. 2B is a rectangular loop. In other examples, a ring can have a different shape, such as oval, circular, polygonal, hexagonal, or any other arbitrary shape. The perimeter of the electronic device 200 refers to the outer boundary of the electronic device 200, where device components are located within this perimeter. The metal ring 202 can be formed of a metal that is electrically conductive, such as aluminum, copper, and so forth. In some examples, the metal ring 202 can be a unitary structure, or multiple structures that are connected or attached together.

The outer housing of the electronic device 200 further includes a rear cover 204 that is attached (such as with a fastener, screws, etc.) to the metal ring 202. The rear cover 204 can be formed of a polymer, a metal, or other rigid material.

The electronic device 200 further includes a display assembly 206, which includes a display panel 208 and a display cover 210, which can be formed of a transparent material such as acrylic or other transparent material. The display panel 208 can display an image. In some examples, the display panel 208 can be a liquid crystal display (LCD) panel, an organic light emitting diode (OLED) display panel, and so forth.

The display cover 210 protects the display panel 208 that is located inside an inner chamber 203 of the electronic device 200, where the inner chamber 203 is defined by the outer housing of the electronic device 200. The display cover 206 can also be part of the outer housing. Thus, collectively, the outer housing structures 202, 204, and 210 can provide an overall outer housing for the electronic device 200, where the housing structures 202, 204, and 210 collectively define the inner chamber 203.

The electronic device 200 further includes a multi-dimensional heat spreader 212 inside the inner chamber 203. The heat spreader 212 provides heat dissipation as well as provides structural support for the outer housing, and more specifically, to the metal ring 202 of the electronic device 200.

To provide the structural support for the metal ring 202, the heat spreader 212 is structurally supported to the metal ring 202. In examples according to FIGS. 2A and 2B, the heat spreader 212 is structurally supported to the metal ring 202 through a support connector 214 that is attached to the metal ring 202. The heat spreader 212 is attached to the support connector 214, which in turn is attached to the metal ring 202. In examples according to FIGS. 2A-2B, the support connector 214 can be generally ring-shaped (rectangular ring shape as shown in FIG. 2B). In other examples, the support connector 214 can have another shape.

In some examples, the support connector 214 can be overmolded onto the metal ring 202. An overmolding process can involve first forming the metal ring 202 to a target shape, by using an injection molding tool. With injection molding, a mold is built that has the shape of a target structure to be built, which in this case is the metal ring 20. A material can be injected into the mold to form the metal ring 202. After the metal ring 202 is formed, the support connector 214 is injected molded onto the metal ring 202 to form a single part.

In other examples, the support connector 214 can be attached to the metal ring 202 using a different technique, such as by using a fastener or the like.

In some examples, the support connector 214 can be formed with an electrically insulating material, such as a polymer or other rigid electrically insulating material. The electrically insulating material of the support connector 214 prevents electrical conduction between the metal ring 202 and the heat spreader 212.

In further examples, the metal ring 202 can provide the dual functionality of providing a portion of the outer housing of the electronic device 200, as well as to provide an antenna for the electronic device 200. The antenna can be used to communicate radio frequency (RF) signals.

FIG. 2A further shows a circuit board 216 that includes electronic components mounted on surfaces of the circuit board 216. Electronic components 104 can be provided on a first surface 218 of the circuit board 216. These electronic components 104 can be thermally contacted to a thermal contact surface 220 of the heat spreader 212. In some examples, one or multiple electronic components 224 can also be mounted on a second, opposite surface 222 of the circuit board 216. Such electronic component(s) 224 mounted on the second surface 222 can generate a relatively low amount of heat, such that they do not have to be thermally contacted to the heat spreader 212.

The display panel 208 can be spaced apart from the heat spreader 212 to thermally insulate the display panel 208 from the heat spreader 212.

The electronic device 200 further includes a battery 226 that provides a power source to the electronic components in the electronic device 200. In some examples, the battery 226 can be thermally contacted to the thermal contact surface 220 of the heat spreader 212. In such examples, the battery 226 can act as a heat sink into which some of the heat transferred by the heat spreader 212 can spread. In other examples, the battery 226 can be spaced apart from the heat spreader 212, and thus thermally insulated from the heat spreader 212.

Figure 3A:
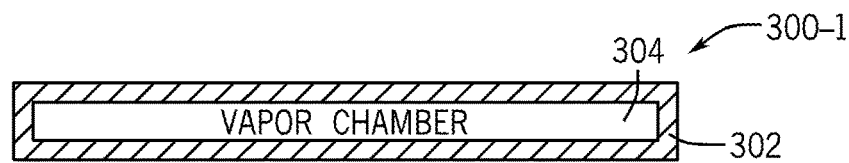
FIGS. 3A and 3B are sectional views of a multi-dimensional heat spreader according to some examples.

In some implementations, as shown in FIG. 3A, a multi-dimensional heat spreader 300-1 (e.g., either the heat spreader 100 or 212 in FIG. 1 or 2, respectively) can perform spreading of heat using a working fluid in a vapor chamber 304 that is defined by a heat spreader housing 302. The heat spreader housing 302 can be formed of a metal or other thermally conductive material. The vapor chamber 304 is a hermetically sealed inner chamber that includes a liquid path to transfer a liquid form of the working fluid, and a vapor conduit to transfer a vapor form of the working fluid. The working fluid can include a thermodynamic fluid such as water (e.g., distilled water), alcohol, ammonia, or any other fluid that can exhibit conversion between liquid and vapor to effect heat transfer.

The liquid path of the vapor chamber 304 can include defined channels inside the heat spreader 300-1, or etched structures in the inner wall of the heat spreader housing 302, to move the liquid form of the working fluid by capillary action. The vapor conduit can include a bores in the vapor chamber 304 through which the vapor form of the working fluid can flow.

When the heat spreader 300-1 is thermally contacted to a heat producing component (or heat producing components), heat from the heat producing component(s) causes the liquid in the vapor chamber 304 to vaporize into a vapor. The vapor is then communicated through the vapor conduit of the vapor chamber 304 for communication back to a cooler area of the heat spreader 300-1, where the vapor is condensed and the condensed liquid is returned by the liquid path of the vapor chamber 304 to a hotter area of the heat spreader 300-1.

Figure 3B:
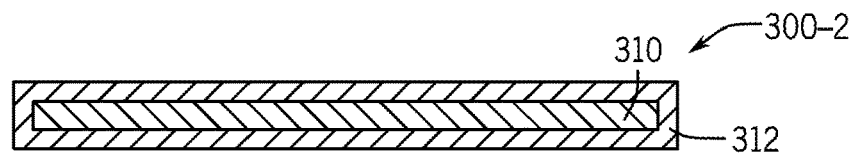

In other implementations, as shown in FIG. 3B, a multi-dimensional heat spreader 300-2 (e.g., either the heat spreader 100 or 212 in FIG. 1 or 2, respectively) can include a thermally conductive layer 310 formed of a first thermally conductive material. The thermally conductive layer 310 is encapsulated by a thermally conductive encapsulant 312 that is formed of a second thermally conductive material that is different from the first thermally conductive material.

In some examples, the first thermally conductive material can include graphite, diamond, copper, and so forth. The second thermally conductive material can include a metal, such as aluminum, copper, and so forth, or alternatively can include another type of thermally conductive material. The first thermally conductive material can have a higher thermal conductivity than the second thermally conductive material.

In examples where the thermally conductive layer 310 is formed of graphite, encapsulating the graphite layer with the thermally conductive encapsulant 312 that is formed of a metal or other rigid material adds mechanical strength to the overall thermal spreader 300-2 while taking advantage of the high thermal conductivity of the thermally conductive layer 310. More generally, the thermally conductive encapsulant 312 has a higher structural strength than the thermally conductive layer 310.

Figure 4:
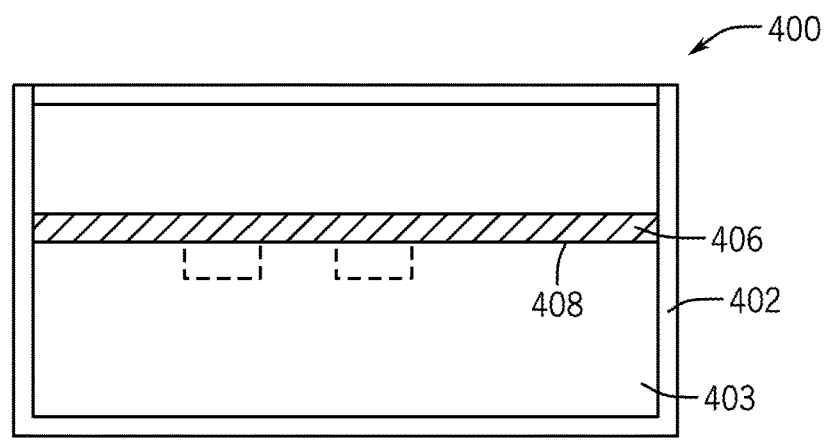
FIG. 4 is a sectional view of a housing and support assembly for an electronic device, according to some examples.

FIG. 4 is a block diagram of a housing and support assembly 400 for an electronic device. The housing and support assembly 400 includes an outer housing to define an inner chamber 403 of the electronic device. The housing and support assembly 400 further includes a multi-dimensional heat spreader 406 structurally engaged with the outer housing 402 to provide structural support for the outer housing 402, the multi-dimensional heat spreader 406 to provide the structural support for the outer housing 402 without use of any distinct support frame attached to the multi-dimensional heat spreader 406. For example, there is no distinct support frame that either is connected to the heat spreader 406, or that encloses the heat spreader 406. The multi-dimensional heat spreader 406 also includes a thermal contact surface 408 to contact heat producing components (represented by dashed boxes) inside the inner chamber 403.

Figure 5:
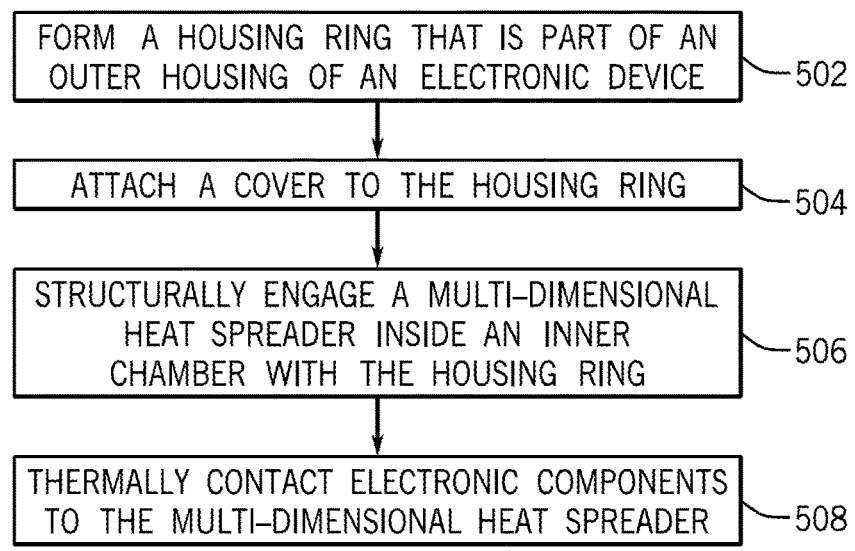
FIG. 5 is a flow diagram of a process of forming an electronic device, according to some examples.

FIG. 5 is a flow diagram of an example process of forming an electronic device, according to some implementations. The process includes forming (at 502) a housing ring (e.g., 202 in FIGS. 2A-2B) that is part of an outer housing of the electronic device, the outer housing defining an inner chamber of the electronic device. In some examples, the housing ring can be formed using an injection molding process. The process further includes attaching (at 504) a cover (e.g., 204 in FIG. 2A) to the housing ring, the cover being part of the outer housing.

The process further includes structurally engaging (at 506) a multi-dimensional heat spreader inside the inner chamber with the housing ring to structurally support the housing ring. In addition, the process includes thermally contacting (at 508) electronic components to the multi-dimensional heat spreader to transfer heat from the electronic components to the multi-dimensional heat spreader. The thermal contact can be a direct thermal contact, or alternatively, an indirect thermal contact through a thermally conductive layer between the heat spreader and the electronic components.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. An electronic device comprising:
    an outer housing including a housing ring;
    a heat spreader inside an inner chamber defined by the outer housing, and the heat spreader structurally engaged to the outer housing to provide structural support for the outer housing, the heat spreader to spread heat along multiple different directions;
    a display cover attached to a display panel, wherein the housing ring extends around a perimeter of the display panel and the display panel is spaced apart from the heat spreader;
    electronic components in thermal contact with a surface of the heat spreader to transfer heat produced by the electronic components to the heat spreader; and
    a support connector attached to the housing ring, wherein the heat spreader is also attached to the support connector structurally supporting the outer housing.

2. The electronic device of claim 1, wherein the heat spreader provides the structural support for the outer housing without use of any distinct support frame attached to the heat spreader.

3. The electronic device of claim 1, wherein the heat spreader comprises a vapor chamber that contains a working fluid to spread heat.

4. The electronic device of claim 1, wherein the heat spreader comprises a thermally conductive layer of a first thermally conductive material, and a thermally conductive encapsulant encapsulating the thermally conductive layer, the thermally conductive encapsulant formed of a second thermally conductive material, the first thermally conductive material having a higher thermal conductivity than the second thermally conductive material.

5. The electronic device of claim 4, wherein the first thermally conductive material is selected from among graphite, copper, and diamond.

6. The electronic device of claim 1, wherein the housing ring comprises a metal ring.

7. The electronic device of claim 1, wherein the housing ring comprises an antenna of the electronic device.

8. The electronic device of claim 1, wherein the support connector is overmolded to the housing ring.

9. The electronic device of claim 1, further comprising an outer cover attached to the housing ring, the outer cover and the housing ring defining the inner chamber.

10. The electronic device of claim 1, further comprising:
    a battery on a second side of the heat spreader, the battery thermally contacted to the heat spreader to provide a heat sink for the heat spreader.

11. A housing and support assembly for an electronic device, comprising:
    an outer housing including a housing ring to define an inner chamber of the electronic device;
    a multi-dimensional heat spreader inside the inner chamber and structurally engaged with the housing ring via a support connector to provide structural support for the outer housing, the multi-dimensional heat spreader to provide the structural support for the outer housing without use of any distinct support frame attached to the multi-dimensional heat spreader, and the multi-dimensional heat spreader comprising a thermal contact surface to contact heat producing components inside the inner chamber; and
    a display cover attached to a display panel, wherein the housing ring extends around a perimeter of the display panel and the display panel is spaced apart from the heat spreader.

12. The housing and support assembly of claim 11, wherein the support connector is overmolded onto the outer housing.

13. A method of forming an electronic device, comprising:
   forming a housing ring that is part of an outer housing of the electronic device, the outer housing defining an inner chamber of the electronic device;
   attaching a cover to the housing ring, the cover being part of the outer housing;
   structurally engaging a multi-dimensional heat spreader inside the inner chamber with the housing ring via a support connector to structurally support the housing ring;
   thermally contacting electronic components to the multi-dimensional heat spreader to transfer heat from the electronic components to the multi-dimensional heat spreader; and
   assembling a display cover attached to a display panel so that the housing ring extends around a perimeter of the display panel and the display panel is spaced apart from the heat spreader.

14. The method of claim 13, wherein the multi-dimensional heat spreader comprises one of:
   a vapor chamber comprising a working fluid to spread heat, and a thermally conductive layer and a thermally conductive encapsulant encapsulating the thermally conductive layer, wherein the thermally conductive encapsulant has a higher structural strength than the thermally conductive layer.

\* \* \* \* \*